United States Patent
Zhang

[11] Patent Number: 5,990,491
[45] Date of Patent: *Nov. 23, 1999

[54] ACTIVE MATRIX DEVICE UTILIZING LIGHT SHIELDING MEANS FOR THIN FILM TRANSISTORS

[75] Inventor: Hongyong Zhang, Kanagawa, Japan

[73] Assignee: Semiconductor Energy Laboratory Co., Ltd., Kanagawa-ken, Japan

[*] Notice: This patent is subject to a terminal disclaimer.

[21] Appl. No.: 08/988,393

[22] Filed: Dec. 10, 1997

Related U.S. Application Data

[62] Division of application No. 08/709,113, Sep. 6, 1996, Pat. No. 5,717,224, which is a continuation of application No. 08/429,168, Apr. 26, 1995, abandoned.

[30] Foreign Application Priority Data

Apr. 29, 1994 [JP] Japan .................................. 6-114449

[51] Int. Cl.⁶ .................................................. H01L 29/04
[52] U.S. Cl. .............................. 257/57; 257/59; 257/66; 257/72; 349/44
[58] Field of Search .................................. 257/57, 59, 66, 257/72, 435, 642, 776; 349/43, 44, 110

[56] References Cited

U.S. PATENT DOCUMENTS

| | | | |
|---|---|---|---|
| 4,103,297 | 7/1978 | McGreivy et al. | 257/72 |
| 4,239,346 | 12/1980 | Lloyd | 257/72 |
| 4,618,878 | 10/1986 | Aoyama et al. | 257/643 |
| 4,680,580 | 7/1987 | Kawahara | 349/39 |
| 4,818,077 | 4/1989 | Ohwada et al. | 349/47 |
| 4,853,760 | 8/1989 | Abe et al. | 257/643 |
| 4,938,565 | 7/1990 | Ichikawa | 349/54 |
| 4,949,141 | 8/1990 | Busta | 257/72 |
| 5,003,356 | 3/1991 | Wakai et al. | 349/43 |
| 5,012,228 | 4/1991 | Masuda et al. | 349/42 |
| 5,051,570 | 9/1991 | Tsujikawa et al. | 349/47 |
| 5,055,899 | 10/1991 | Wakai et al. | 349/43 |
| 5,056,895 | 10/1991 | Kahn | 349/47 |
| 5,084,905 | 1/1992 | Sasaki et al. | 349/43 |
| 5,117,278 | 5/1992 | Bellersen et al. | 257/642 |
| 5,327,001 | 7/1994 | Wakai | 257/350 |
| 5,365,079 | 11/1994 | Kodaira et al. | 257/59 |
| 5,434,433 | 7/1995 | Takasu et al. | 257/59 |
| 5,485,019 | 1/1996 | Yamazaki et al. | 257/57 |
| 5,495,353 | 2/1996 | Yamazaki et al. | 349/43 |
| 5,499,123 | 3/1996 | Mikoshiba | 349/44 |
| 5,604,380 | 2/1997 | Nishimura et al. | 257/642 |
| 5,612,799 | 3/1997 | Yamazaki et al. | 349/42 |
| 5,641,974 | 6/1997 | den Boer et al. | 257/59 |
| 5,650,637 | 7/1997 | Kodaira et al. | 257/72 |
| 5,696,386 | 12/1997 | Yamazaki | 257/57 |
| 5,717,224 | 2/1998 | Zhang | 257/72 |

FOREIGN PATENT DOCUMENTS

| | | | |
|---|---|---|---|
| 55-32026 | 3/1980 | Japan . | |
| 59-72745 | 4/1984 | Japan | 257/642 |
| 1-156725 | 6/1986 | Japan . | |
| 61-141174 | 6/1986 | Japan . | |
| 1-283839 | 11/1989 | Japan | 257/642 |

OTHER PUBLICATIONS

H. Ono Kikuo et al., "Flat Panel Display '91", p. 109, 1991.
"Planarized Black Matrix on TFT Structure for TFT–LCD Monitors", SID 97 Digest, pp. 19–22, Kim et al., 1997.

*Primary Examiner*—Minh Loan Tran
*Attorney, Agent, or Firm*—Sixbey, Friedman, Leedom & Ferguson, PC; Eric J. Robinson

[57] ABSTRACT

A channel forming region of a thin-film transistor is covered with an electrode and wiring line that extends from a source line. As a result, the channel forming region is prevented from being illuminated with light coming from above the thin-film transistor, whereby the characteristics of the thin-film transistor can be made stable.

22 Claims, 5 Drawing Sheets

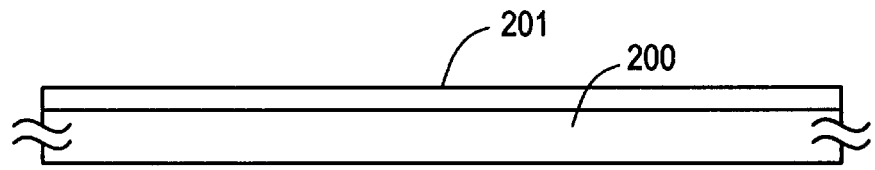
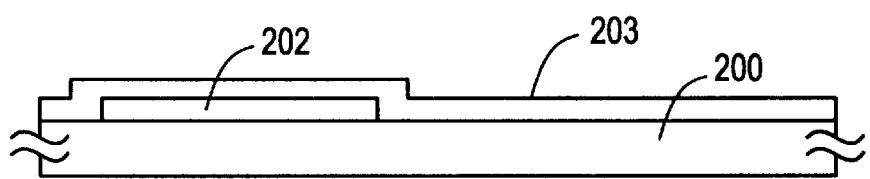
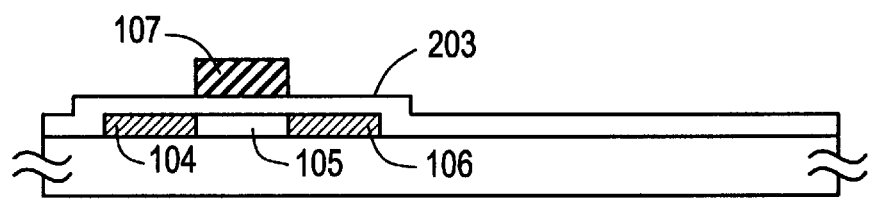
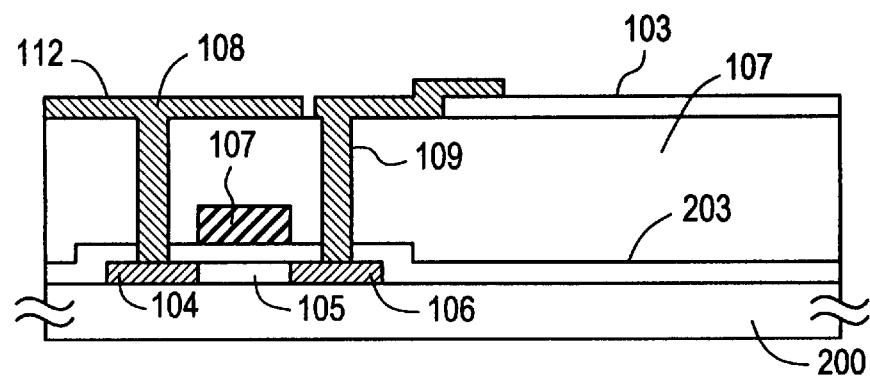

ACTIVE MATRIX DEVICE UTILIZING LIGHT SHIELDING MEANS FOR THIN FILM TRANSISTORS

This is a Divisional application of Ser. No. 08/709,113, filed Sep. 6, 1996, now U.S. Pat. No. 5,717,224; which is a continuation of Ser. No. 08/429,168, filed Apr. 26, 1995, now abandoned.

BACKGROUND OF THE INVENTION

The present invention relates to the configuration of a thin-film transistor used in an electro-optical device such as a liquid crystal display device.

In an electro-optical device that is represented by an active matrix type liquid crystal display device, there is known a configuration in which thin-film transistors (TFTs) are used as drive elements and switching elements. Thin-film transistors are configured using a semiconductor (usually, silicon semiconductor) thin film that is formed on a glass substrate by vapor-phase deposition. Thin-film transistors are also used for an image sensor and other devices.

FIGS. 4(A) and 4(B) are a sectional view and a top view, respectively, of a one-pixel portion of an active matrix circuit using conventional thin-film transistors. FIG. 4(A) is taken along line A–A' in FIG. 4(B). A thin-film transistor whose cross-section is shown in FIG. 4(A) is composed of a glass substrate 401, an amorphous silicon or crystalline silicon semiconductor active layer formed on the glass substrate 401 and having a source region 402, a channel forming region 403 and a drain region 404, a gate insulating film 405 made of silicon dioxide or silicon nitride, an interlayer film 407 made of silicon dioxide, a drain contact portion 412, a source contact portion 411, a drain electrode 410, and a transparent conductive film (ITO film or the like) 408 that is connected to the drain electrode 410 and constitutes a pixel electrode. (The source and drain are reversed for a certain operation of the TFT.)

The source region 402 of the thin-film transistor shown in FIG. 4(A) is connected to a source line 409 via the source contact portion 411. A gate electrode 406 is connected to a gate line 413. While usually the source line 409 and the gate line 413 are perpendicular to each other, this is not always the case. In general, the gate electrode 406 and the gate line 413 are made of a metal such as aluminum or a semiconductor such as polysilicon added with phosphorus.

FIGS. 4(A) and 4(B) show a single pixel. Actually, an active matrix circuit is formed by disposing at least one pixel as shown in FIGS. 4(A) and 4(B) at each intersection of the source lines and the gate lines. A liquid crystal panel is configured by sealing a liquid crystal material between an active matrix substrate on which the active matrix circuit is formed and an opposed substrate. There are following types of liquid crystal display devices that use the liquid crystal panel having the above configuration.

(1) Liquid crystal display is realized by applying light (back light) to the liquid crystal panel.

(2) A video image is produced by applying high-intensity light to the liquid crystal display panel and projecting, onto a screen, light that is transmitted from the liquid crystal panel. (Liquid crystal projector)

(3) A reflecting plate is disposed on the back side of the liquid crystal display panel, and display is effected by causing external light to be reflected by the reflecting plate.

In particular, where light is irradiated from the glass substrate side in cases (1) and (2) above, it is necessary to shield the active layer, particularly the channel forming region, from the illumination light. This originates from the fact that the active layer (semiconductor layer denoted by 402–404 in FIGS. 4(A) and 4(B)) is made of amorphous silicon or crystalline silicon such as polysilicon. In general, the resistance of a silicon semiconductor varies when it receives light. In particular., when an amorphous silicon or crystalline silicon film is used, which includes dangling bonds, its electrical characteristics are greatly varied by illumination with high-intensity light. Further, the resistance of an intrinsic semiconductor (used for the channel forming region) is varied more greatly by illumination with light than an N-type or P-type semiconductor (used for the source and-drain regions). Therefore, it is absolutely necessary to prevent the channel forming region from being illuminated.

Where light 414 is incident from above the gate electrode 406 in the thin-film transistor (top gate TFT) having the structure in which the gate electrode 406 is located over the semiconductor active layer (see FIGS. 4(A)), it seems that no light may enters the channel forming region 403 due to the gate electrode 406 serving as a mask.

Actually, however, part of the incident light goes around the gate electrode 406, to enter the channel forming region 403. As a result, the conductivity of the channel forming region 403 is varied by the illumination and its characteristics are also varied.

That is, it is impossible for only the gate electrode 406 to completely prevent light from entering the channel forming region 403. This problem is remarkable when the channel forming region and the gate electrodes are formed in a self-aligned manner. To solve this problem, a light shielding layer or film is effectively used, but this increases the number of manufacturing steps.

SUMMARY OF THE INVENTION

An object of the present invention is to realize, without increasing the number of manufacturing steps, a structure of a thin-film transistor which is basically of the type shown in FIGS. 4(A) and 4(B) and in which light is not incident on nor enters the active layer, particularly the channel forming region. In particular, the invention is effective when applied to an active matrix circuit having thin-film transistors whose sources and drains are formed by a self-align process that produces a very small overlap of the gate electrode and the source and drain regions.

The invention is characterized in that in an active matrix circuit, a source line or an electrode or wiring line (they cannot be clearly discriminated from each other) extending from the source line is so formed as to cover a channel forming region, to use the source line or an electrode or wiring line as a light shielding layer for the channel forming region. Since the channel forming region is included in a portion where a gate electrode and a semiconductor active layer overlap with each other, forming a source line or an electrode or wiring line extending from the source line to cover such a portion is approximately equivalent to the above.

In the above structure, examples of a substrate having an insulative surface are a glass substrate, a plastic substrate, a metal or semiconductor substrate on whose surface an insulating film is formed.

FIG. 2(D) shows an example of the structure in which the source line or the electrode or wiring line extending from the source line of the thin-film transistor is so formed as to cover at least the channel forming region. In FIG. 2(D), a source line electrode/wiring line 112 that is connected to a source region 104 of a thin-film transistor via a contact portion 108 covers a channel forming region 105. That is, in FIG. 2(D), both of the electrode/wiring line 112 and the gate electrode 107 serve as light shielding films for the underlying channel forming region 105.

It may be possible to realize a similar structure by using an electrode/wiring line for connecting the pixel electrode 103 and the drain region 106. However, in such a case, a parasitic capacitance between the pixel electrode 103 and the gate electrode 107 becomes large and a potential variation of the gate line 107 affects the pixel electrode 107, causing serious problems in the operation of the active matrix. (For example, refer to H. Ono Kikuo et al: "Flat-Panel Display '91," page 109.)

On the other hand, in the invention, a capacitive coupling between the source line and the gate line due to a parasitic capacitance adversely affects the operation speed of the thin-film transistor, which does not influence the pixel potential. Therefore, no problem occurs in terms of the image display. Further, in the invention, a parasitic capacitance that occurs due to the source line laid over the gate electrode does not cause any substantial problem, because it is smaller than 1/10 of the parasitic capacitance at the intersection of the source line and the gate line of the active matrix.

FIG. 1(A) is a specific top view of the structure whose cross-section is shown in FIG. 2(D). FIG. 1(B) is a circuit diagram corresponding to FIG. 1(A). As is apparent from FIG. 1(A), although the pixel electrode 103 is connected to the drain region 106 via a contact portion 109 and a wiring line, the wiring line does not cover the channel forming region. On the other hand, an extension 112 of the source line, which is connected to the source region 104 of the thin-film transistor via a contact portion 108 is so formed as to cover the channel forming region (i.e., the portion where the gate electrode 107 and the semiconductor active layer overlap with each other), and serves as a light shielding layer.

In summary, the problem that the characteristics of a thin-film transistor is varied or deteriorated due to illumination light coming from the electrode side can be solved by constructing the electrode/wiring line that is connected to the source (or drain) of the thin-film transistor so that it serves as a light shielding layer for the channel forming region. The electrode/wiring line that is connected to the drain (or source) is connected to the pixel electrode.

To construct a liquid crystal display panel by using the invention, it is necessary that an active matrix substrate be illuminated from above, i.e., that a light source, an opposed substrate, and the active matrix substrate be arranged in this order. The light shielding effect of the invention is entirely lost if the active matrix substrate is illuminated from below, i.e., from the back side of the thin-film transistor.

BRIEF DESCRIPTION OF THE DRAWINGS

FIGS. 2(A)–2(D) show a manufacturing process of the thin-film transistor according to the first embodiment of the invention;

DESCRIPTION OF THE PREFERRED EMBODIMENTS

Embodiment 1

Figure 1A:
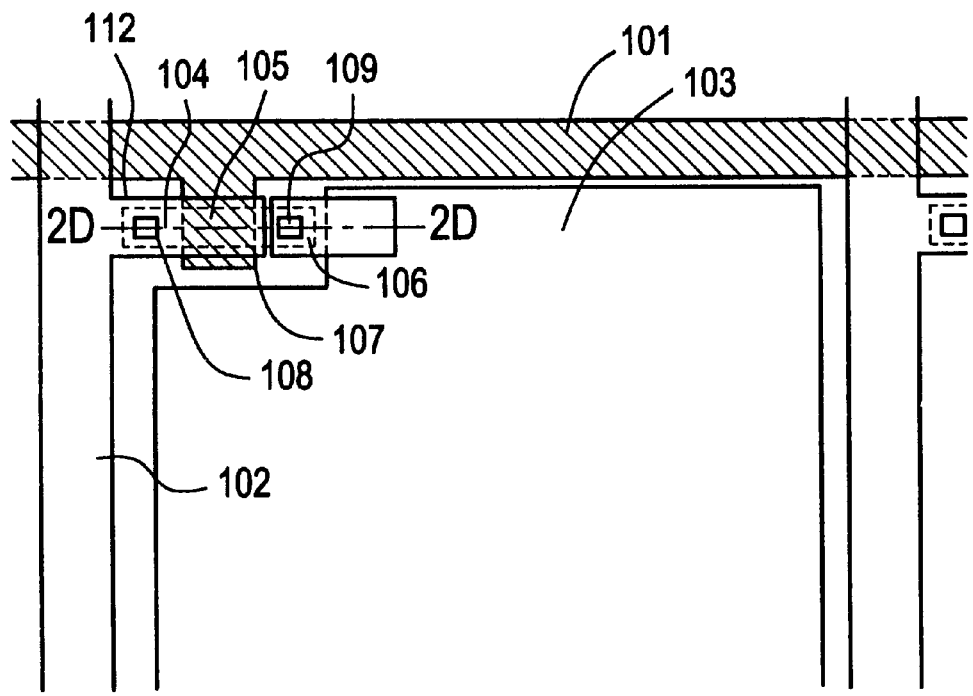
FIGS. 1(A) and 1(B) are a schematic top view and a circuit diagram, respectively, of a one-pixel portion including a thin-film transistor according to a first embodiment of the present invention.
Figure 1B:
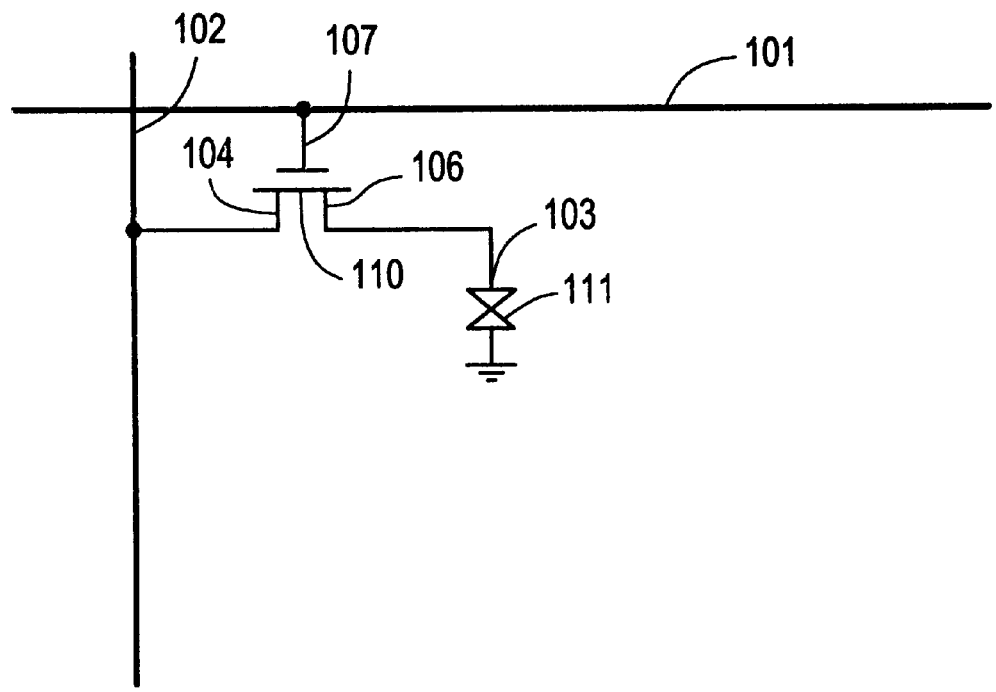

FIGS. 1(A) and 1(B) are a schematic top view and a circuit diagram, respectively, of a first embodiment of the present invention. That is, FIGS. 1(A) and 1(B) show a one-pixel portion of an active matrix type liquid crystal display device. More specifically, FIG. 1(A) shows a pixel electrode 103 provided for a pixel, a source region 104, a channel forming region 105 and a drain region 106 together constituting a switching thin-film transistor that is connected to the pixel electrode 103, a source line 102 connected to the source region 104 via a contact portion 108, a gate electrode 107 formed on the channel region 105 through a gate insulating film (not shown), and a gate line 101 extending from the gate electrode 107.

FIG. 1(B) shows a thin-film transistor 110, and a liquid crystal 111 that is connected to the drain region 106 of the thin-film transistor 110 (actually, via a contact portion 109 as shown in FIG. 1(A)) and supplied with a voltage from the pixel electrode 103.

FIG. 2(D) shows a cross-section taken along line B–B' in FIG. 1(A). In this embodiment, as shown in FIGS. 1(A) and 2(D), the thin-film transistor is so configured that part of a source electrode wiring line 112 covers more than half of the thin-film transistor. The source lines 102 and the gate line 101 are formed of a metal such as aluminum, a semiconductor, or a laminated body thereof.

With the structure shown in FIGS. 1(A) and 2(D), since illumination light from the gate electrode side can be shielded by the extending source electrode wiring line 112, more than half of the thin-film transistor can be prevented from illumination. In particular, the channel forming region 105 can be shielded from light that would otherwise come around the side faces of the gate electrode 107.

FIGS. 2(A)–2(D) illustrate a manufacturing process of the thin-film transistor shown in FIGS. 1(A) and 2(D). A description will be hereinafter made of a manufacturing process of a thin-film transistor that is provided for one pixel of a matrix. It goes without saying that the same structure is formed for each of a number of pixels arranged in a matrix.

First, a glass substrate 200 is prepared which may be any material having an insulative surface. For example, it may be a semiconductor or metal substrate on which surface an insulating film is formed.

A silicon dioxide film or a silicon nitride film as an undercoat film (not shown) is formed on the surface of the glass substrate 200, to prevent diffusion of impurities from the glass substrate 200 and to reduce stress during a heat treatment.

Then, a thin-film semiconductor 201 is formed which constitutes an active layer of the thin-film transistor. In this embodiment, a 1,000-Å-thick Amorphous silicon thin film is formed by plasma CVD or low-pressure thermal CVD (see FIG. 2(A)).

Since this embodiment needs a crystallized semiconductor layer as an active layer, the amorphous silicon thin film 201 is crystallized in this step. The crystallization is effected by a heat treatment (thermal annealing) of 600° C. for 12 hours in an inert atmosphere. To facilitate crystallization, an element such as nickel may be added by a small amount.

The crystallization may be effected by illumination with laser light or equivalent high-intensity light. Further, laser light or equivalent high-intensity light may be applied to a silicon film that has been crystallized by thermal annealing. Where the thin-film transistor is allowed to have low-grade performance, the amorphous silicon film 201 may be used as it is.

Then, the crystallized silicon semiconductor thin film is patterned into a size of the intended active layer of the thin-film transistor. Thus, an active layer 202 of the thin-film transistor is formed. A 1,000-Å-thick silicon dioxide film 203 to become a gate insulating film is then formed by plasma CVD or sputtering.

Subsequently, a gate electrode 107 is formed by depositing a metal such as aluminum or a polysilicon film doped with phosphorus and then patterning it. A gate line 101 (see FIG. 1(A)) is formed at the same time.

Then, a source 104 and a drain 106 are formed by implanting phosphorus ions. Since the gate electrode 107 serves as a mask, the phosphorus ions are implanted into the regions 104 and 106, but not into the region 105. In this manner, the channel forming region 105 is formed at the same time. Because of the implantation of phosphorus, the source 104 and drain 106 are of an N type (see FIG. 2(C)). To obtain a P-type source and drain, boron may be implanted, for instance.

Next, annealing is performed by illumination with laser light to anneal portions damaged by the above ion implantation and to activate implanted impurity ions. In this embodiment, a KrF excimer laser is used. This step may be effected by thermal annealing at a low temperature of about 600° C. (see FIG. 2(C)).

Then, contact portions 108 and 109 are formed by forming a silicon dioxide film 107 as an interlayer insulating layer, performing patterning for hole formation, and forming metal wiring lines. As shown in FIG. 1(A), the wiring pattern is such that the source wiring line 112 extending from the source line 102 covers more than half of the thin-film transistor.

It is particularly important that the source wiring line 112 be so provided as to cover the top portion of the channel forming region 105. With this structure, illumination light from the gate electrode side can be prevented from reaching the channel forming region 105, to thereby avoid a variation or deterioration of the characteristics of the thin-film transistor.

Embodiment 2

This embodiment relates to a thin-film transistor having a structure in which a gate electrodes is made of aluminum, and an oxide layer is formed on the top and side faces of the gate electrode by anodic oxidation to increase the breakdown voltage.

Referring to FIGS. 3(A)–3(D), a description will be made of a manufacturing process of a thin-film transistor according to this embodiment. First, a 2,000-Å-thick silicon dioxide film as an undercoat film (not shown) is deposited on a glass substrate 300. An amorphous silicon thin film 301 is formed thereon by plasma CVD or low-pressure thermal CVD (see FIG. 3(A)).

Then, the amorphous silicon film 301 is crystallized by subjecting it to a heat treatment of 600° C. and 12 hours, and then patterned into a size of the intended active layer of the thin-film transistor, to form an active layer 302 of a crystalline silicon thin film. A 1,000-Å-thick silicon dioxide film 303 serving as a gate insulating film is formed thereon by plasma CVD or sputtering (see FIG. 3(B)).

Next, a 5,000-Å-thick film mainly made of aluminum and serving as a gate electrode is formed. By adding scandium of 0.1–0.5 wt %, for instance, 0.2 wt % to aluminum, hillocks can be prevented from occurring in a subsequent anodic oxidation step etc.

Subsequently, the aluminum film is etched to form a gate electrode 304. An oxide layer 305 of 1,000–3,000 Å, for instance, about 2,000 Å in thickness is formed by performing anodic oxidation in an approximately neutral electrolyte using the gate electrode 304 as an anode. The voltage applied to the gate electrode 304 is about 120 V at the maximum. It is preferable that the oxide layer 305 have a sufficiently high breakdown voltage. To this end, the oxide layer 305 is desired to be sufficiently dense. The anodic oxide coating 305 produced in the above manner is called a barrier-type anodic oxide film, and has a breakdown voltage that amounts to 90% of the maximum application voltage, which is 120 V in this embodiment (see FIG. 3(C)).

Then, phosphorus ions are implanted into regions 306 and 307 to form a source 306 and a drain 307. A channel forming region 308 is formed at the same time in a self-aligned manner. In contrast to the case of the first embodiment, this embodiment provides what is called an offset state in which the source 306 and drain 307 are spaced from the gate electrode 304 by the thickness of the anodic oxide coating 305. The offset state is effective in reducing the leak current that is characteristic of the thin-film transistor.

Figure 3A:
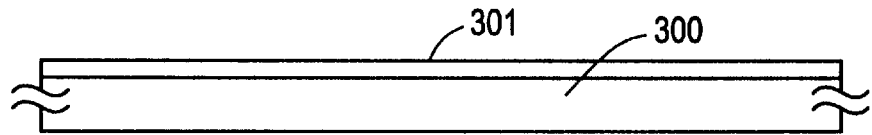
FIGS. 3(A)–3(D) show a manufacturing process of a thin-film transistor according to a second embodiment of the invention.
Figure 3B:
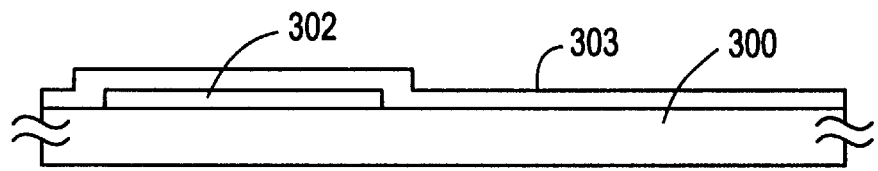
Figure 3C:
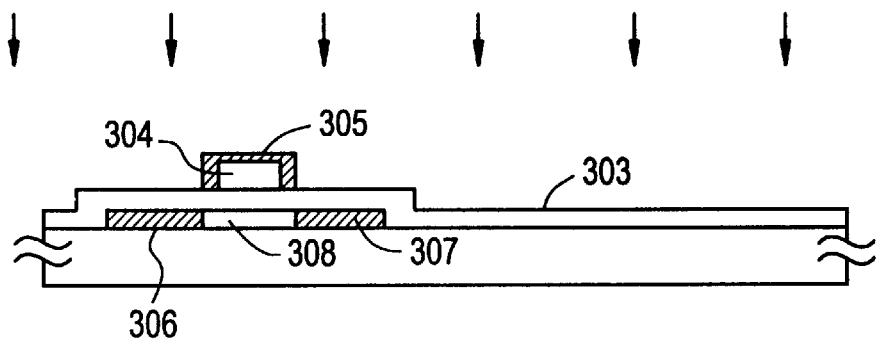
Figure 3D:
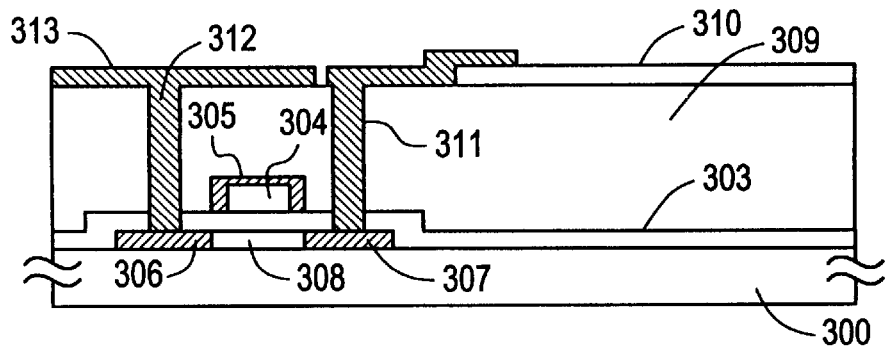
Figure 4A:
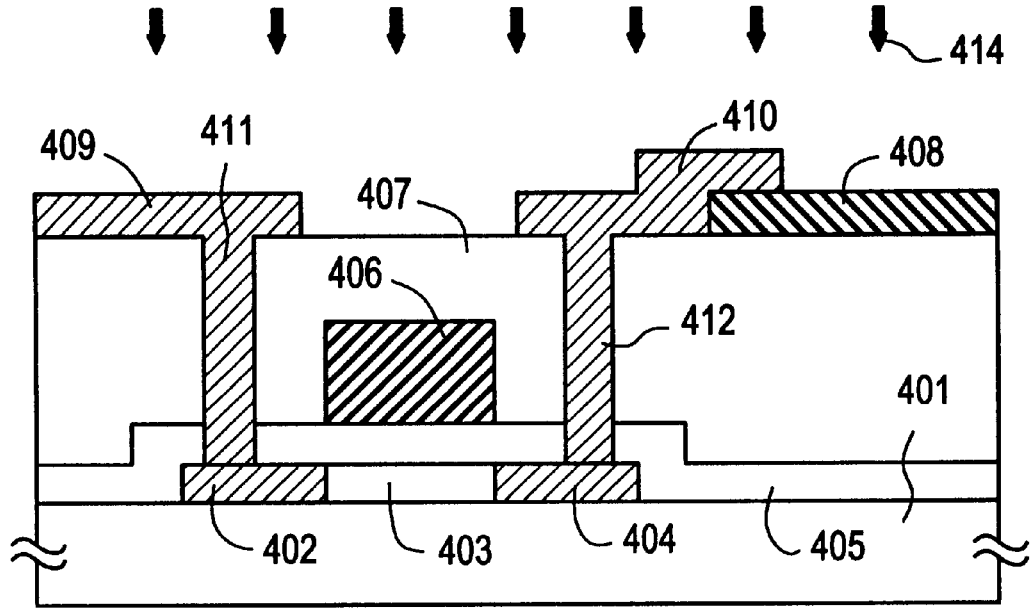
FIGS. 4(A) and 4(B) are a sectional view and a top view, respectively, of a conventional thin-film transistor for a one-pixel portion.
Figure 4B:
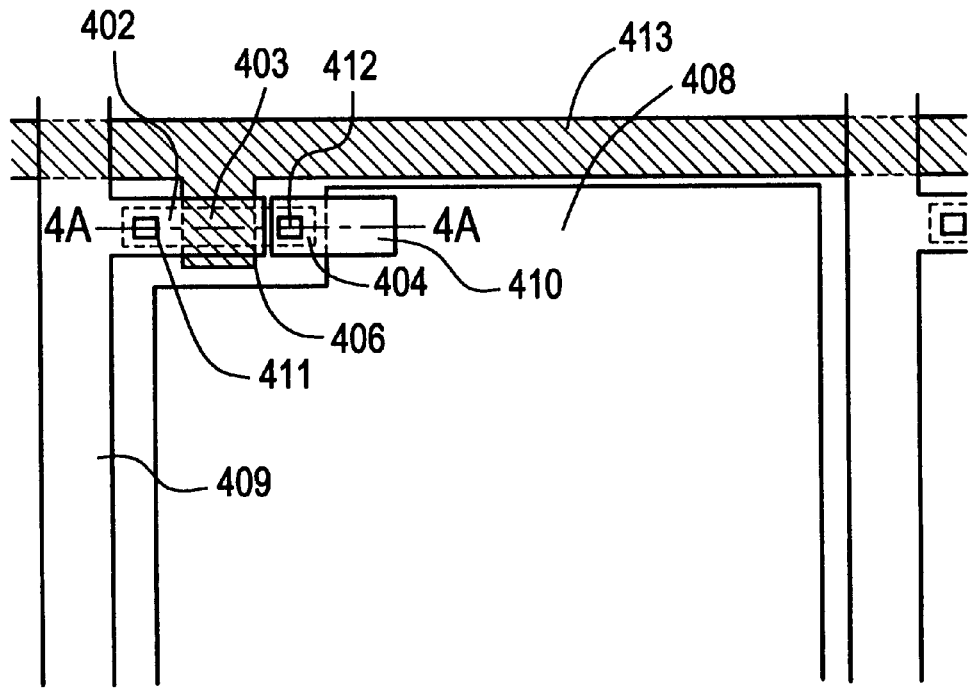

Then, the ion-implanted regions are annealed and implanted ions are activated by illumination with KrF excimer laser light (see FIG. 3(C)).

Subsequently, a silicon dioxide film 309 of about 7,000 Å in thickness is deposited as in interlayer insulating layer by plasma CVD. The interlayer insulating layer may be made of an organic resin or a multilayer of silicon dioxide and an organic resin.

Finally, a pixel electrode 310 is formed by ITO, and then etching is performed for hole formation, and metal electrodes/wiring lines are formed. The metal electrode/wiring line 313 extends to the source line and contacts with the source 306 via a contact portion 312. A drain electrode/wiring line extending from a contact portion 311 is connected to the pixel electrode 310.

Also in this embodiment, since the electrode 313 extending to the source line is so formed as to cover the source 306 and the channel forming region 303 of the thin-film transistor, no light is irradiated to the channel forming region 308. Thus, there can be realized the thin-film transistor that is free from a variation or deterioration of the characteristics due to light illumination.

In particular, where the oxide layer is provided around the gate electrode that is mainly made of aluminum as in this embodiment, it is effective to cover the channel forming region by the electrode/wiring line connected to the source. Since the aluminum oxide layer is transparent, if there were provided no shielding layer, light coming from the gate electrode side likely would reach the channel forming region passing through the offset regions (parts of the channel forming region 308 that are not covered with the gate electrode 304) or through refraction. By forming the electrode/wiring line 313 of this embodiment, the offset gate regions and the channel forming region can be prevented from being illuminated with light.

In the case of the first embodiment, there exists only the interlayer insulating layer between the gate electrode and the source line. However, since the thin-film transistor portion is complicate in structure, i.e., has many steps, the single interlayer insulating layer may be insufficient in step coating ability, resulting in insufficient insulation. In contrast, in this embodiment, because the anodic oxide layer having a sufficiently high breakdown voltage is provided on the top and side faces of the gate electrode in addition to the interlayer insulating layer, the leak current between the source line and the gate electrode can be reduced as much as possible.

In this embodiment, the N-channel TFT is formed because phosphorus is used as impurities. However, a P-channel TFT is generally preferable for a pixel of an active matrix to the N-channel TFT that suffers from a large leak current. To form a P-channel TFT, boron may be doped instead of phosphorus in the step of FIG. 3(C).

Embodiment 3

Figure 5:
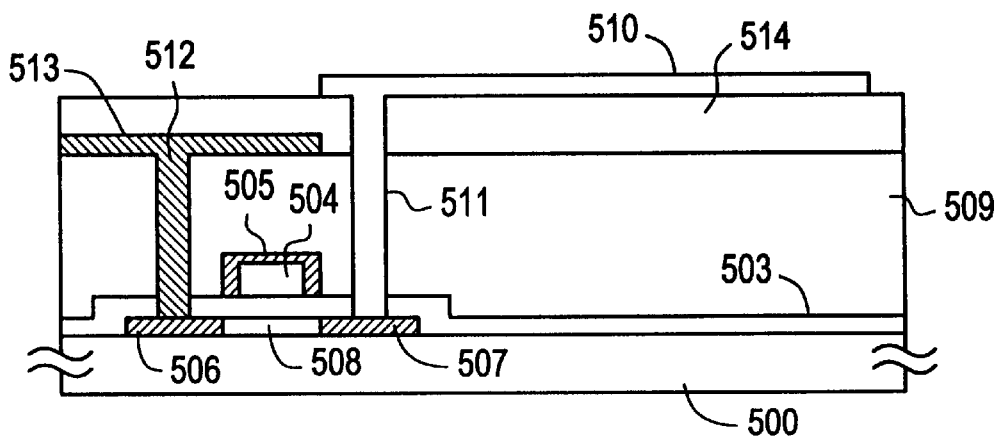
FIG. 5 shows a structure of a thin-film transistor according to a third embodiment of the invention.

FIG. 5 shows a third embodiment of the invention. While the pixel and the drain of the TFT are interconnected by the metal wiring line in the first and second embodiments, they may be interconnected directly by an ITO film. In this embodiment, a layer including an ITO film and a layer including the source line are made different from each other. With this structure, electrolytic corrosion can be suppressed in patterning the ITO film. Steps to the source line formation are approximately the same as those in the second embodiment.

Referring to FIG. 5, a polysilicon active layer including a source 506, a channel forming region 508 and a drain 507 is formed on a substrate/undercoat oxide film 500, and a silicon dioxide gate insulating film 503 is formed thereon. The source 506 and the drain 507 are of a P type. A gate electrode 504 is formed on the channel forming region 508, and an anodic oxide film 505 is formed around the gate electrode 504. An interlayer insulating layer 509 is formed so as to cover the TFT. First, a contact hole 512 for the source 506 is formed, and a source line 513 is formed there. Also in this embodiment, the electrode and metal electrode/wiring line 513 that extends from the source line covers the channel forming region 508.

Then, after a second interlayer insulating layer 514 is formed, a contact hole 511 for the drain 507 is formed. Silicon nitride, aluminum oxide and aluminum nitride, which are used as a passivation film, are more appropriate as a material of the second interlayer insulating film than silicon dioxide. A pixel electrode 510 that is an ITO film is directly connected to the drain 507.

Embodiment 4

Figure 6:
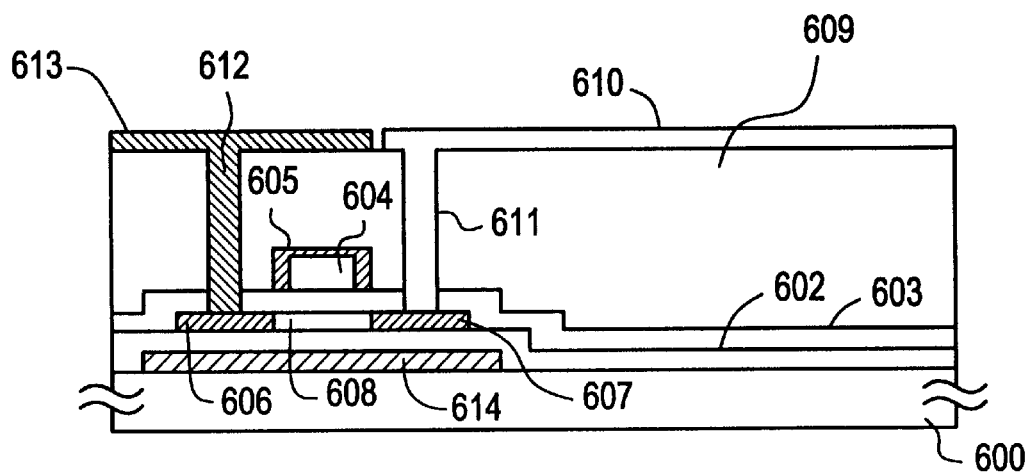
FIG. 6 shows a structure of a thin-film transistor according to a fourth embodiment of the invention.

FIG. 6 shows a fourth embodiment of the invention. While in the first to third embodiments, the channel forming region of the TFT is protected from light coming from above, such structures may be combined with a structure for shielding the TFT from light coming from below (see FIG. 6). This embodiment is characterized in that a light shielding film 614 is provided under the TFT. The light shielding film 614 is made of a metal such as chromium and grounded. Referring to FIG. 6, the light shielding film 614 is formed on a substrate 600, and a silicon dioxide undercoat film 602 is formed thereon. Further, a polysilicon active layer including a source 606, a channel forming region 608 and a drain 607, and a silicon dioxide gate insulating film 603 are formed.

A gate electrode 604 is formed on the channel forming region 608, and an anodic oxide film 605 is formed around the gate electrode 604. An interlayer insulating layer 609 is so formed as to cover the TFT, and contact holes 611 and 612 are formed for the drain 607 and the source 606, respectively. A metal electrode/-wiring line 613 is connected to the source 606, and A pixel electrode 610 that is an ITO film is connected to the drain 607. Also in this embodiment, the metal electrode/wiring line 613 that extends from the source line covers the channel forming region 608.

Although in FIG. 6, the source line and the pixel electrode are included in the same layer, they may be included in different layers as in the case of the third embodiment.

As described above, by forming the source line so that it covers the channel forming region of the corresponding thin-film transistor, the channel forming region can be prevented from being illuminated with light coming from above the thin-film transistor. Therefore, a variation or deterioration of the characteristics of the thin-film transistor due to light illumination can be avoided.

What is claimed is:

1. An active matrix device comprising:
   a substrate;
   a switching element comprising a thin film transistor provided over said substrate;
   a transparent organic resin film provided over said thin film transistor;
   a light shielding layer provided on said transparent organic resin film;
   an interlayer insulating film provided over said light shielding layer; and
   a pixel electrode provided on said interlayer insulating film and electrically connected with said switching element.

2. The device of claim 1 wherein said interlayer insulating film comprises aluminum oxide, silicon nitride or aluminum nitride.

3. The device of claim 1 wherein said pixel electrode is directly connected with said thin film transistor.

4. The device of claim 1 wherein said interlayer insulating film comprises aluminum oxide, silicon nitride or aluminum nitride.

5. An active matrix device comprising:
   a substrate;
   a switching element comprising a thin film transistor provided over said substrate;
   a transparent organic resin film provided over said thin film transistor;
   a source line connected with a source region of said thin film transistor and comprising a light shielding part provided over said transparent organic resin film, said light shielding part being provided over a channel forming region of said thin film transistor;
   an interlayer insulating film provided over said light shielding part; and
   a pixel electrode provided over said interlayer insulating film and electrically connected with said switching element.

6. The device of claim 5 wherein said interlayer insulating film comprises aluminum oxide, silicon nitride or aluminum nitride.

7. An active matrix device comprising:
   a substrate;
   a switching element comprising a thin film transistor provided over said substrate;
   a transparent organic resin film provided directly on said thin film transistor;

a source line connected with a source region of said thin film transistor and comprising a light shielding part provided over said transparent organic resin film, said light shielding part being provided over a channel forming region of said thin film transistor;

an interlayer insulating film provided over said light shielding part; and a pixel electrode provided on said interlayer insulating film and electrically connected with said switching element.

8. The device of claim 7 wherein said interlayer insulating film comprises aluminum oxide, silicon nitride or aluminum nitride.

9. An active matrix device comprising:

a substrate;

a switching element comprising a thin film transistor provided over said substrate;

a transparent organic resin film provided over said thin film transistor;

a source line connected with a source region of said thin film transistor and comprising a light shielding part provided over said transparent organic resin film, said light shielding part being provided over a channel forming region of said thin film transistor;

an interlayer insulating film provided over said light shielding part; and a pixel electrode provided on said interlayer insulating film and directly connected with a drain region of said thin film transistor.

10. The device of claim 9 wherein said interlayer insulating film comprises aluminum oxide, silicon nitride or aluminum nitride.

11. An active matrix device comprising:

a substrate;

a switching element comprising a thin film transistor provided over said substrate;

a transparent organic resin film provided over said thin film transistor;

a source line connected with a source region of said thin film transistor and comprising a light shielding part provided over said transparent organic resin film, said light shielding part wholly overlapping with a channel forming region of said thin film transistor;

an interlayer insulating film provided over said light shielding part; and a pixel electrode provided on said interlayer insulating film and electrically connected with said switching element.

12. The device of claim 11 wherein said interlayer insulating film comprises aluminum oxide, silicon nitride or aluminum nitride.

13. An active matrix device comprising:

a substrate;

at least one thin film transistor provided over said substrate;

a transparent organic resin film provided over said thin film transistor;

a light shielding layer provided on said transparent organic resin film;

an interlayer insulating film provided over said light shielding layer; and a pixel electrode provided on said interlayer insulating film and electrically connected with said thin film transistor.

14. The device of claim 13 wherein said interlayer insulating film comprises aluminum oxide, silicon nitride or aluminum nitride.

15. An active matrix device comprising:

a substrate;

at least one thin film transistor provided over said substrate;

a transparent organic resin film provided over said thin film transistor;

a source line connected with a source region of said thin film transistor and comprising a light shielding part provided over said transparent organic resin film, said light shielding part being provided over a channel forming region of said thin film transistor;

an interlayer insulating film provided over said light shielding part; and a pixel electrode provided over said interlayer insulating film and electrically connected with said thin film transistor.

16. The device of claim 15 wherein said interlayer insulating film comprises aluminum oxide, silicon nitride or aluminum nitride.

17. An active matrix device comprising:

a substrate;

at least one thin film transistor provided over said substrate;

a transparent organic resin film provided directly on said thin film transistor;

a source line connected with a source region of said thin film transistor and comprising a light shielding part provided over said transparent organic resin film, said light shielding part being provided over a channel forming region of said thin film transistor;

an interlayer insulating film provided over said light shielding part; and a pixel electrode provided on said interlayer insulating film and electrically connected with said thin film transistor.

18. The device of claim 17 wherein said interlayer insulating film comprises aluminum oxide, silicon nitride or aluminum nitride.

19. An active matrix device comprising:

a substrate;

at least one thin film transistor provided over said substrate;

a transparent organic resin film provided over said thin film transistor;

a source line connected with a source region of said thin film transistor and comprising a light shielding part provided over said transparent organic resin film, said light shielding part being provided over a channel forming region of said thin film transistor;

an interlayer insulating film provided over said light shielding part; and a pixel electrode provided on said interlayer insulating film and directly connected with a drain region of said thin film transistor.

20. The device of claim 19 wherein said interlayer insulating film comprises aluminum oxide, silicon nitride or aluminum nitride.

21. An active matrix device comprising:

a substrate;

at least one thin film transistor provided over said substrate;

a transparent organic resin film provided over said thin film transistor;

a source line connected with a source region of said thin film transistor and comprising a light shielding part provided over said transparent organic resin film, said light shielding part wholly overlapping with a channel forming region of said thin film transistor;

an interlayer insulating film provided over said light shielding part; and a pixel electrode provided on said interlayer insulating film and electrically connected with said thin film transistor.

22. The device of claim 21 wherein said interlayer insulating film comprises aluminum oxide, silicon nitride or aluminum nitride.

* * * * *